(12) United States Patent
Sugimoto

(10) Patent No.: US 9,035,696 B2
(45) Date of Patent: May 19, 2015

(54) AMPLIFIER

(71) Applicant: Sumitomo Electric Industries, Ltd., Osaka-shi (JP)

(72) Inventor: Yoshiyuki Sugimoto, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 11 days.

(21) Appl. No.: 14/091,094

(22) Filed: Nov. 26, 2013

(65) Prior Publication Data

US 2014/0145789 A1    May 29, 2014

(30) Foreign Application Priority Data

Nov. 26, 2012  (JP) ................................. 2012-257583

(51) Int. Cl.
| | |
|---|---|
| *H03F 1/02* | (2006.01) |
| *H03F 3/08* | (2006.01) |
| *H03F 3/45* | (2006.01) |

(52) U.S. Cl.
CPC .............. *H03F 3/087* (2013.01); *H03F 3/4508* (2013.01); *H03F 3/456* (2013.01); *H03F 2203/45306* (2013.01); *H03F 2203/45521* (2013.01)

(58) Field of Classification Search
USPC ............................................ 330/9, 308, 259
IPC .................................................. H03F 1/02,3/08
See application file for complete search history.

(56) References Cited

U.S. PATENT DOCUMENTS

| | | | | |
|---|---|---|---|---|
| 5,508,645 | A | * | 4/1996 | Castellucci et al. ............ 327/77 |
| 7,536,114 | B2 | * | 5/2009 | Gieseler et al. ................ 398/210 |
| 2002/0191263 | A1 | * | 12/2002 | Hoang et al. ................... 359/189 |
| 2003/0025562 | A1 | * | 2/2003 | Andreou et al. ............... 330/308 |
| 2005/0133691 | A1 | * | 6/2005 | Doppke et al. ............ 250/214 A |
| 2008/0230683 | A1 | * | 9/2008 | Uo et al. .................... 250/214 A |
| 2014/0306760 | A1 | * | 10/2014 | Piepenstock et al. .......... 330/261 |

FOREIGN PATENT DOCUMENTS

JP         2012-010231 A      1/2012

* cited by examiner

*Primary Examiner* — Patricia T Nguyen
(74) *Attorney, Agent, or Firm* — Venable LLP; Michael A. Sartori

(57) ABSTRACT

An amplifier includes a first input terminal, a second input terminal, a TIA, and a compensation circuit. The TIA includes a first transistor, a second transistor, a first current source connected to the first input terminal and an emitter of the first transistor, a second current source connected to the second input terminal and an emitter of the second transistor, a first load resistor connected to a collector of the first transistor, and a second load resistor connected to a collector of the second transistor. A bias voltage is supplied to bases of the first and second transistors, the compensation circuit adjusts a first load current and a second load current based on voltage signals, and the TIA outputs the voltage signals based on collector voltages of the first and second transistors.

8 Claims, 8 Drawing Sheets

AMPLIFIER

TECHNICAL FIELD

The present invention relates to an amplifier.

RELATED BACKGROUND ART

Background

For example, in a communication system, such as a Dual Polarization Quadrature Phase Shift Keying (DP-QPSK) system, a phase-modulated signal light and a local oscillation light are merged to interfere with each other in an optical hybrid circuit, so as to convert them into an intensity-modulated signal. Practically, a pair of optical signals, each of which has an opposite phase to each other, is obtained. Therefore, it is preferable to use a type of optical receiver with differential input terminals in order to enhance the Signal-to-Noise (S/N) ratio. As such an optical receiver, there is an optical receiver including two photodiodes arranged in parallel and an amplifier. Further, as such an amplifier, there is a type of amplifier with emitter-input configuration (for example, see Japanese Patent Laid-Open Publication No. 2012-10231.

SUMMARY

In such an optical receiver, a difference between responsivities of two photodiodes, and so on, may cause an offset between photocurrents output from the two photodiodes, respectively. Therefore, when an emitter-input amplifier is used, which receives a pair of photocurrents output from two photodiodes arranged in parallel as complementary input signals and outputs complementary output signals, an offset may be caused between the complementary output signals.

An amplifier according to one aspect of the present invention is an amplifier for receiving a pair of complementary current signals and outputting a pair of complementary voltage signals. The amplifier includes (a) a pair of trans-impedance amplifiers for receiving the complementary current signals and converting the complementary current signals into the complementary voltage signals; and (b) a compensation circuit for compensating for an offset between the complementary voltage signals. Each of the trans-impedance amplifiers includes a resistor, a transistor, and a current source, where they are connected in series to each other between a power source and a ground. The trans-impedance amplifiers outputs a voltage which depends on a current flowing through the resistor and is changed by the complementary current signals flowing through the current source, as one of the complementary voltage signals. The compensation circuit receives the complementary voltage signals, and adjusts currents, which flow through the resistors based on the offset between the complementary voltage signals, thus, reduces an offset between the voltage drops at the resisters.

The present invention will be more fully understood from the detailed description given herein below and the accompanying drawings, which are given by way of illustration only and are not to be considered as limiting the present invention. Further, scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

DETAILED DESCRIPTION

[Explanation of the Embodiment]

Figure 1:
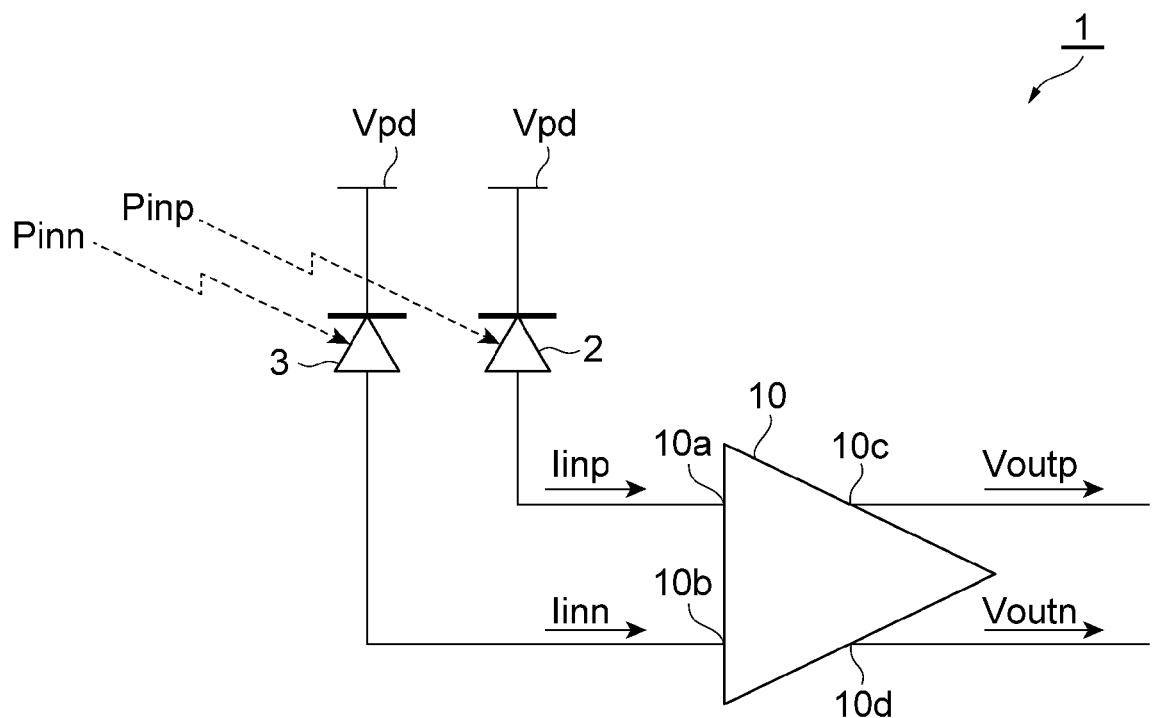
FIG. 1 is a schematic view showing a configuration of an optical receiver according to a first embodiment of the present invention.

Firstly, the contents of the embodiment of the present invention will be listed and explained below.

An amplifier according to one aspect of the present invention is an amplifier for receiving a pair of complementary current signals and outputting a pair of complementary voltage signals. The amplifier includes (a) a pair of trans-impedance amplifiers each receiving the complementary current signal and converting the complementary current signal into the complementary voltage signal; and (b) a compensation circuit for compensating for an offset between the complementary voltage signals. Each of the trans-impedance amplifiers includes an emitter-input circuit configured by a resistor, a transistor, and a current source, where they are connected in series to each other between a power source and a ground. Each of the trans-impedance amplifiers outputs a voltage which depends on a current flowing through the resistor and is indirectly varied by the complementary current signal absorbed in the current source, as one of the complementary voltage signals. The compensation circuit receives the complementary voltage signals, and adjusts currents, which flow through the resistors, based on the offset between the complementary voltage signals, and reduces an offset between voltage drops at the resistors.

In such an amplifier, when an offset is caused between the complementary current signals, an offset is induced between currents flowing through resistors of the trans-impedance amplifiers, and an offset is also induces between the complementary voltage signals. In the amplifier, the compensation circuit receives the complementary voltage signals; adjusts the currents that flows through the resistors respectively based on the offset between the complementary voltage signals; and reduces the offset between the voltage drops at the resisters so that the offset between the differential voltage signals is reduced.

The compensation circuit may negatively feeds only the low frequency component of the complementary voltage signals back to the currents flowing through the resistors.

The compensation circuit may include a differential circuit having a pair of transistors and a compensation current source connected to both of the transistors. In the differential circuit, resistors included in the trans-impedance amplifiers may be operable as the load resistors of the differential circuit of the compensation circuit. The pair of transistors may receive the complementary voltage signals, and may adjust compensation currents, which flow through the transistors respectively and merged into the compensation current source, based on the offset between the complementary voltage signals.

The current source in the trans-impedance amplifier may be a voltage-controlled current source. The compensation circuit may adjust a current determined by the current source, which flows through the resistors, by providing control voltages to the current sources based on the complementary voltage signals.

The trans-impedance amplifier may have another resistor instead of the current source, and the compensation circuit may feed the offset between the complementary voltage signals back to control terminals of the transistors.

Each of the trans-impedance amplifiers may include another transistor connected in parallel to the transistor for bypassing a current flowing through the resistor and the transistor. The amplifier may further include: a first peak hold circuit for detecting and holding a peak value of one of the complementary voltage signals; a second peak hold circuit for detecting and holding a peak value of the other of the complementary voltage signals; an average detector for detecting an average of the complementary voltage signals; a first amplitude adjusting circuit for adjusting a current flowing through another transistor in one of the trans-impedance amplifier based on a first difference between the peak value of the one of the complementary voltage signals and the average, and a second amplitude adjusting circuit for adjusting a current flowing through the another transistor in the other of the trans-impedance amplifier based of a second difference between the peak value of the other of the complementary voltage signals and the average, and bypassing thus adjusted currents from the transistors.

The amplitude adjusting circuit may compare, with a predetermined reference value, the first difference and the second difference to adjust the current flowing through each of the other transistors.

[Details of the Embodiment]

Next, a detailed description of an amplifier according to the present embodiment will be described as referring to the accompanying drawings. In the following drawings, the same reference numerals or characters are assigned to the same or similar elements and the duplicate description is omitted.

[First Embodiment]

FIG. 1 is a schematic view showing a configuration of an optical receiver according to a first embodiment. As shown in FIG. 1, an optical receiver 1 is a type of the differential optical receiver used in a communication system, such as a Differential Quadrature Phase Shift Keying (DQPSK) system, a DP-QPSK system, and so on. The optical receiver 1 includes a first PD 2, a second PD 3, and an amplifier 10. The optical receiver 1 receives a pair of optical signals, one of which Pinp has a normal phase; while, the other Pinn has a phase opposite to the normal phase. The first PD 2 receives the optical signal Pinp and converts this optical signal Pinp into a photocurrent Iinp with the normal phase. An anode of the first PD 2 is connected to a non-inverting input 10a of the amplifier 10 and a cathode thereof is connected to a power supply Vpd. The second PD 3 receives the other optical signal Pinn and converts this optical signal Pinn into another photocurrent Iinn with the opposite phase. An anode of the second PD 3 is connected to an inverting input terminal 10b of the amplifier 10 and a cathode thereof is connected to the power supply Vpd.

The amplifier 10 converts the pair of photocurrents (complementary current signals) into a pair of differential voltages (complementary voltage signals) and outputs the pair of converted complementary voltages. The amplifier 10 includes the input terminal 10a (one of differential input terminals), the input terminal 10b (the other of the differential input terminals), an output terminal 10c, and an output terminal 10d. In the amplifier 10, the photocurrent Iinp output from the first PD 2 is input to the input terminal 10a as an input current, and the Photocurrent Iinn output from the second PD 3 is input to the input terminal 10b as an input current. Further, the amplifier 10 outputs a voltage signal Voutp from the output terminal 10c as an output voltage and outputs a voltage signal Voutn from the output terminal 10d as another output voltage.

Figure 2:
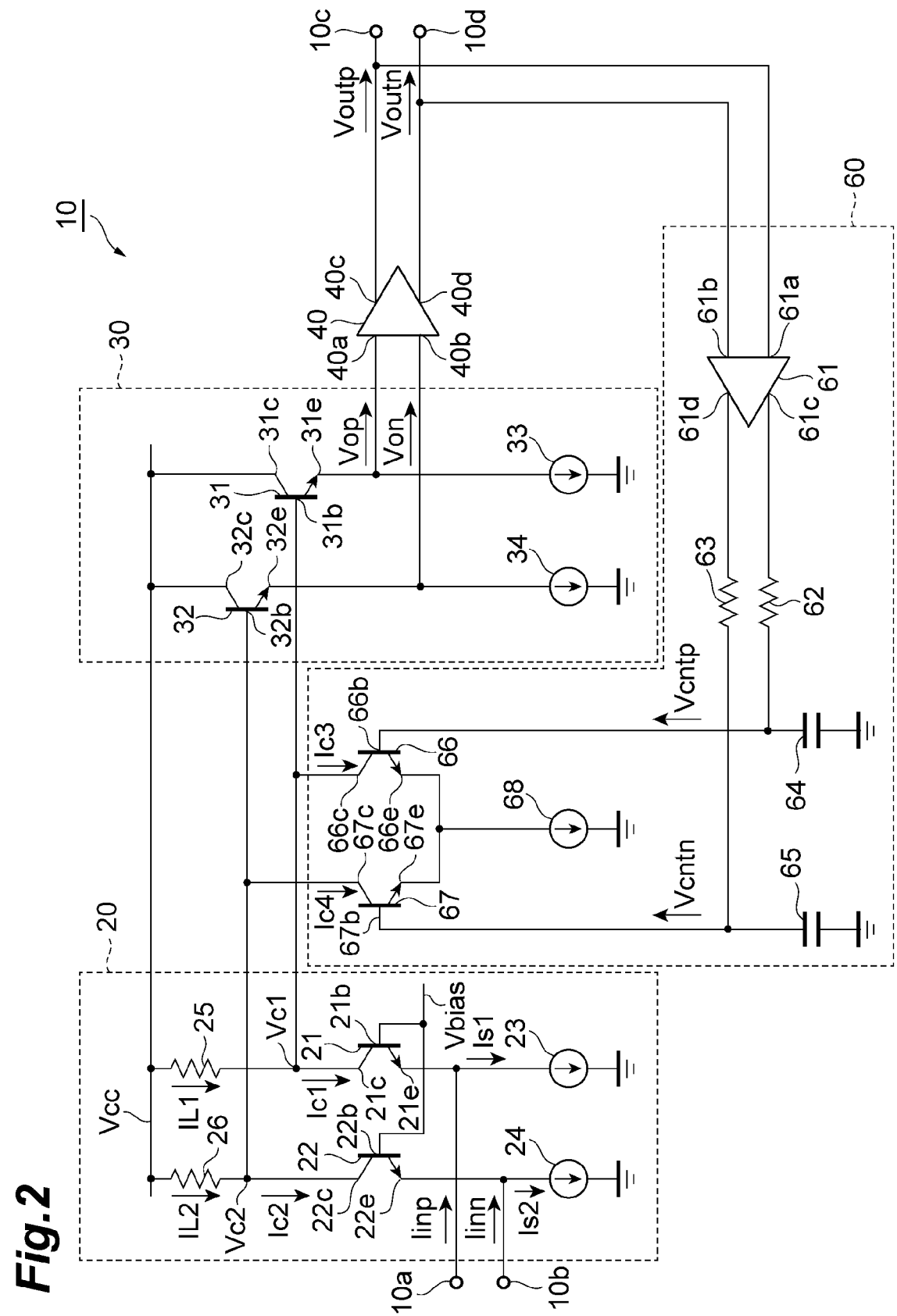
FIG. 2 is a circuit diagram of the amplifier shown in FIG. 1.

FIG. 2 is a circuit diagram of the amplifier 10. As shown in FIG. 2, the amplifier 10 includes a TIA 20, an emitter follower 30, an amplifier 40, and a compensation circuit 60. The TIA 20 is a trans-impedance amplifier which converts a pair of input currents into a pair of voltages and outputs the pair of converted voltages as a pair of output signals. The TIA 20 includes a first transistor 21, a second transistor 22, a first current source 23, a second current source 24, a first load resistor 25, and a second load resistor 26.

The first transistor 21 is, for example, an NPN transistor. A bias voltage Vbias, which is predetermined, is supplied to a base 21b (first control terminal) of the first transistor 21. An emitter 21e (one of current terminals) of the first transistor 21 is connected to the input 10a and one end of the first current source 23. A collector 21c (the other of the current terminals) of the first transistor 21 is connected to a power supply Vcc through the first load resistor 25. The first current source 23 is a type of constant current source and is configured by a transistor or a resistor. An opposite end of the first current source 23 is grounded. The first load resistor 25 has resistance of about 500Ω. The first transistor 21, the first current source 23, and the first load resistor 25 constitute a emitter-input amplifier, which operates as a first TIA. Meanwhile, an input voltage Vin of the input 10a is set by the bias voltage Vbias. Specially, the input voltage Vin is lowered by a base-emitter voltage Vbe1 of the first transistor 21 from the bias voltage Vbias, and has a value of about 1 V.

The second transistor 22 is, for example, an NPN transistor. A bias voltage Vbias is supplied to a base 22b (second control terminal) of the second transistor 22. An emitter 22e (one of current terminals) of the second transistor 22 is connected to the input 10b and one end of the second current source 24. A collector 22c (the other of the current terminals) of the second transistor 22 is connected to the power supply Vcc through the second load resistor 26. The second current source 24 is a type of constant current source and is configured by a transistor or a resistor. An opposite end of the second current source 24 is grounded. The second load resistor 26 has resistance of about 500Ω. The second transistor 22, the second current source 24, and the second load resistor 26 constitute a emitter-input amplifier, which operates as a second TIA. Meanwhile, an input voltage Vin of the input 10b is set by the bias voltage Vbias. Specially, the input voltage Vin is lowered by a base-emitter voltage Vbe2 of the second transistor 22 from the bias voltage Vbias, and has value of about 1 V.

The emitter follower 30, which shifts input levels and includes a transistor 31, a transistor 32, a current source 33, and a current source 34. The transistor 31 is, for example, an NPN transistor. A base 31b of the transistor 31 is connected to the collector 21c of the first transistor 21. A collector 31c of the transistor 31 is connected to the power supply Vcc. An emitter 31e of the transistor 31 is connected to one end of the current source 33. The current source 33 is a constant current source. An opposite end of the current source 33 is grounded. Thus, the transistor 31 and the current source 33 operate as an emitter follower.

The transistor 32 is, for example, an NPN transistor. A base 32b of the transistor 32 is connected to the collector 22c of the second transistor 22. A collector 32c of the transistor 32 is connected to the power supply Vcc. An emitter 32e of the transistor 32 is connected to one end of the current source 34. The current source 34 is a constant current source. An opposite end of the current source 34 is grounded. Thus, the transistor 32 and the current source 34 operate as an emitter follower.

The amplifier 40 is a differential amplifier for amplifying a difference between the two voltage signals output from the TIA 20 through the emitter follower 30. An input 40a of the amplifier 40 is connected to the emitter 31e of the transistor 31. Another input 40b of the amplifier 40 is connected to the emitter 32e of the transistor 32. An output 40c of the amplifier 40 is connected to the output 10c. Another output 40d of the amplifier 40 is connected to the output 10d. The amplifier 40 is a type of limiting amplifier (LIA) or an Automatic Gain Control amplifier (AGCA). However, the amplifier 40 may be configured through a combination of an LIA and an AGCA depending on the necessary gain and the linearity. Further, the emitter follower 30 and the amplifier 40 may be omitted depending on applications, specifications, performances, and so on, of the amplifier 10.

The compensation circuit 60 is for compensating for an offset between the two outputs, Voutp and Voutn. The compensation circuit 60 includes an amplifier 61, a resistor 62, a resistor 63, a capacitor 64, a capacitor 65, a third transistor 66, a fourth transistor 67, and a third current source 68 (compensation current source). The amplifier 61 is a differential amplifier for amplifying the difference between the two voltage signals, Voutp and Voutn. An input 61a of the amplifier 61 is connected to the output 10c. Another input 61b of the amplifier 61 is connected to the output 10d. An output 61c of the amplifier 61 is connected to a base 66b (third control terminal) of the third transistor 66 through a low pass filter constituted by the resistor 62 and the capacitor 64. Another output 61d of the amplifier 61 is connected to a base 67b (fourth control terminal) of the fourth transistor 67 through a low pass filter constituted by the resistor 63 and the capacitor 65.

One end of the resistor 62 is connected to the output 61c of the amplifier 61, and an opposite end of the resistor 62 is connected to one end of the capacitor 64 and the base 66b of the third transistor 66. The resistor 62 has resistance of about 10 kΩ. One end of the resistor 63 is connected to the output 61d of the amplifier 61 and an opposite end of the resistor 63 is connected to one end of the capacitor 65 and the base 67b of the fourth transistor 67. The resistor 63 has resistance of about 10 kΩ. An opposite end of the capacitor 64 is grounded. The capacitor 64 has capacitance of about 10 pF. An opposite end of the capacitor 65 is grounded. The capacitor 65 has capacitance of about 10 pF.

The third transistor 66 is, for example, an NPN transistor. A base 66b of the third transistor 66 is connected to an opposite end of the resistor 62 and one end of the capacitor 64. An emitter 66e (one of current terminals) of the third transistor 66 is connected to one end of the third current source 68. A collector 66c (the other of the current terminals) of the third transistor 66 is connected to the collector 21c of the first transistor 21 and the base 31b of the transistor 31. The fourth transistor 67 is an NPN transistor. A base 67b of the fourth transistor 67 is connected to an opposite end of the resistor 63 and one end of the capacitor 65. An emitter 67e (one of current terminals) of the fourth transistor 67 is connected to one end of the third current source 68. A collector 67c (the other of the current terminals) of the fourth transistor 67 is connected to the collector 22c of the second transistor 22 and the base 32b of the transistor 32. The third current source 68 is a constant current source. One end of the third current source 68 is connected to the emitter 66e of the third transistor 66 and the emitter 67e of the fourth transistor 67, and an opposite end of the third current source 68 is grounded. Thus, the third transistor 66, the fourth transistor 67, and the third current source 68 constitute a differential amplifier (differential circuit), which shunts a first load current IL1 and a second load current IL2.

The amplifier 10, which receives the pair of complementary current signals, Iinp and Iinn, and outputting the pair of differential voltage signals, Voutp and Voutn, includes the TIA 20 and the compensation circuit 60. The TIA 20 includes a pair of trans-impedance amplifiers, which receives a pair of complementary current signals and converts the pair of complementary current signals into a pair of complementary voltage signals. The compensation circuit 60 compensates for an offset between the complementary voltage signals. Each of the pair of trans-impedance amplifiers includes a resistor, a transistor, and a current source. The resistor, the transistor, and the current source are connected in series to each other between the power supply Vcc and the ground GND. In each of the trans-impedance amplifier, an increase of an input current, which flows through the current source, decreases a current flowing through the resistor to raise the voltage at a collector of the transistor, which is output as a voltage signal. The compensation circuit receives the complementary voltage signals and adjusts compensation currents, which flow through the resistors in the TIA 20 based on the offset between the complementary voltage signals to compensate for the offset thereof. Further, the negative feedback done by the compensation circuit 60 works only for the low frequency component of the complementary voltage signals.

The compensation circuit 60 includes a differential circuit having the pair of transistors (the third transistor 66 and the fourth transistor 67) and the third current source 68 commonly connected to both of the transistors. In the differential circuit, the pair of transistors receives the complementary voltage signals, and adjusts compensation currents, which flow through the load resistors included in the trans-impedance amplifiers and merged at the third current source 68, to compensate for the offset of the complementary voltage signals.

Next, an operation of the amplifier 10 will be described. The first PD 2 outputs the photocurrent Iinp corresponding to a magnitude of the optical signal Pinp, to the input 10a of the amplifier 10. Similarly, the second PD 3 outputs the photocurrent Iinn corresponding to a magnitude of the optical signal Pinn, to the input 10b of the amplifier 10. In the TIA 20, since the sum of the photocurrent Iinp input to the input 10a and a collector current Ic1 of the first transistor 21 is kept constant by the first current source 23, the collector current Ic1 decreases as the photocurrent Iinp increases. Since input impedance of the emitter follower configured by the transistor 31 and the current source 33 is high enough, the sum of the collector current Ic1 of the first transistor 21 and a collector current Ic3 of the third transistor 66 is almost equal to the first load current IL1 flowing through the first load resistor 25. Further, a voltage obtained by subtracting a voltage drop at the first load resistor 25 caused by the first load current IL1 from the power supply voltage Vcc is equal to a collector voltage Vc1 (first voltage) of the first transistor 21. That is, the collector voltage Vc1 increases as the photocurrent Iinp increases, and the collector voltage Vc1 decreases as the photocurrent Iinp decreases. Thus, the photocurrent Iinp is converted into the collector voltage Vc1 by a first TIA configured by the first transistor 21, the first current source 23, and the first load resistor 25. Similarly, the photocurrent Iinn is converted into a collector voltage Vc2 (second voltage) of the second transistor 22 by a second TIA configured by the second transistor 22, the second current source 24, and the second load resistor 26.

In the emitter follower circuit 30, when the collector voltage Vc1 is input to the base 31b of the transistor 31, a voltage signal Vop obtained by subtracting a base-emitter voltage Vbe of the transistor 31 from the collector voltage Vc1 is output from the emitter 31e of the transistor 31. Similarly, a voltage signal Von obtained by subtracting a base-emitter voltage Vbe of the transistor 32 from the collector voltage Vc2 is output from the emitter terminal 32e of the transistor 32. Further, a difference between the voltage signals, Vop and Von, is amplified by the amplifier 40 to output the voltage signal Voutp from the output 10c and output the voltage signal Voutn from the output 10d. In the operation above described, common mode noise of the voltage signals, Vop and Von, is removed by the differential configuration of the amplifier 40, which is sometimes denoted as the common mode rejection ration.

In the meantime, two photocurrents, Iinp and Iinn, usually accompany with an offset due to a difference between the responsivities of the first PD 2 and the second PD 3, and so on. It is known that the offset increases in proportion to intensities of the optical signals, Pinp and Nun When the photocurrents, Iinp and Iinn, accompanied with the offset are input, an offset is caused between the voltage signals, Voutp and Voutn. Thus, the compensation circuit 60 compensates for the offset between the voltage signals, Voutp and Voutn, by adjusting the first load current IL1 and the second load current IL2.

In detail, the amplifier 61 amplifies a difference between the voltage signals, Voutp and Voutn, as a differential signal. One of the signals amplified by the amplifier 61 is output as a first offset control signal Vcntp having a low frequency component filtered through the resistor 62 and the capacitor 64, and the other of the differential signals amplified by the amplifier 61 is output as a second offset control signal Vcntn having a low frequency component filtered through the resistor 63 and the capacitor 65. The first offset control signal Vcntp is input to the base 66b of the third transistor 66. Further, the second offset control signal Vcntn is input to the base 67b of the fourth transistor 67. As a result, the collector current Ic3 of the third transistor 66 and the collector current Ic4 of the fourth transistor 67 are controlled to adjust the first load current IL1 and the second load current IL2.

For example, when the photocurrent Iinp is larger than an average current Iave, which is an average of the photocurrents, Iinp and Iinn, by a predetermined offset current value Ioff, and the photocurrent Iinn is smaller than the average current value Iave by the offset current Ioff; the collector current Ic1 decreases by the offset current Ioff, and the collector current Ic2 increases by the offset current Ioff, as compared with the state of no offset. Further, the first load current IL1 decreases by the offset current Ioff, and the second load current IL2 increases by the offset current Ioff. As a result, the voltage signal Voutp becomes larger than the voltage signal Voutn.

Then, the first offset control signal Vcntp is larger than the second offset control signal Vcntn. The first offset control signal Vcntp is input to the base terminal 66b of the third transistor 66, and the second offset control signal Vcntn is input to the base terminal 67b of the fourth transistor 67, so that the collector current Ic3 increases by the offset current Ioff, and the collector current Ic4 decreases by the offset current Ioff. Here, the first load current IL1 is equal to the sum of the collector current Ic1 of the first transistor 21 and the collector current Ic3 of the third transistor 66. Further, the second load current IL2 is equal to the sum of the collector current Ic2 of the second transistor 22 and the collector current Ic4 of the fourth transistor 67. Thus, when the collector current Ic3 increases by the offset current Ioff, the first load current IL1 increases by the offset current Ioff. Further, when the collector current Ic4 decreases by the offset current Ioff, the second load current IL2 decreases by the offset current Ioff.

Accordingly, a voltage drop at the first load resistor 25 increases, and the collector voltage Vc1 of the first transistor 21 decreases. Further, a voltage drop at the second load resistor 26 decreases and the collector voltage Vc2 of the second transistor 22 increases. As described above, a change of the first load current IL1 and a change of the second load current IL2, which are caused by the offset between the photocurrents, Iinp and Iinn, are compensated for by the compensation circuit 60. As a result, a difference between the voltage signals, Voutp and Voutn, decreases, and the offset between the voltage signals, Voutp and Voutn, is compensated for.

Meanwhile, when the photocurrent Iinp is smaller than the average current Iave by the offset current Ioff and the photocurrent Iinn is larger than the average current Iave by the offset current Ioff, the collector current Ic1 increases by the offset current Ioff and the collector current Ic2 decreases by the offset current Ioff, as compared with the state of no offset. Further, the first load current IL1 increases by the offset current Ioff, while, the second load current IL2 decreases by the offset current Ioff. As a result, the voltage signal Voutp is smaller than the voltage signal Voutn.

Then, the first offset control signal Vcntp becomes smaller than the second offset control signal Vcntn. The first offset control signal Vcntp is input to the base terminal 66b of the third transistor 66 and the second offset control signal Vcntn is input to the base terminal 67b of the fourth transistor 67, so that the collector current Ic3 decreases by the offset current Ioff and the collector current Ic4 increases by the offset current Ioff. Further, when the collector current Ic3 decreases by the offset current Ioff, the first load current IL1 decreases by the offset current Ioff. Further, when the collector current Ic4 increases by the offset current Ioff, the second load current IL2 increases by the offset current Ioff.

Accordingly, the voltage drop at the first load resistor 25 decreases, and the collector voltage Vc1 of the first transistor 21 increases. Further, the voltage drop at the second load resistor 26 increases, and the collector voltage Vc2 of the second transistor 22 decreases. As described above, a change of the first load current IL1 and a change of the second load current IL2, which are caused by the offset between the photocurrents, Iinp and Iinn, are compensated for by the compensation circuit 60. As a result, a difference between the voltage signals, Voutp and Voutn, decreases, and the offset between the voltage signals, Voutp and Voutn is compensated for.

Figure 3A:
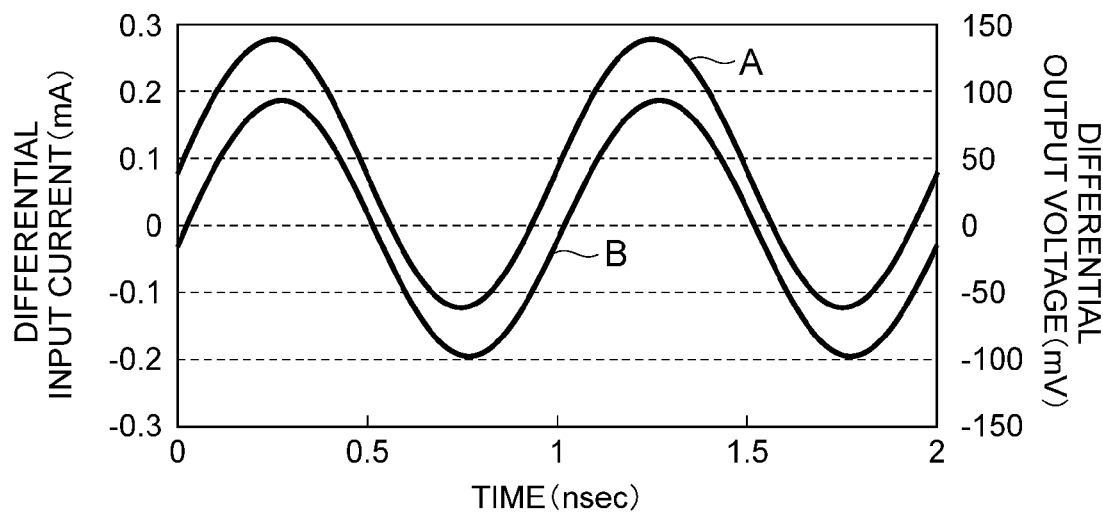
FIG. 3A shows waveforms of input currents and output voltages of the amplifier of FIG. 1.
Figure 3B:
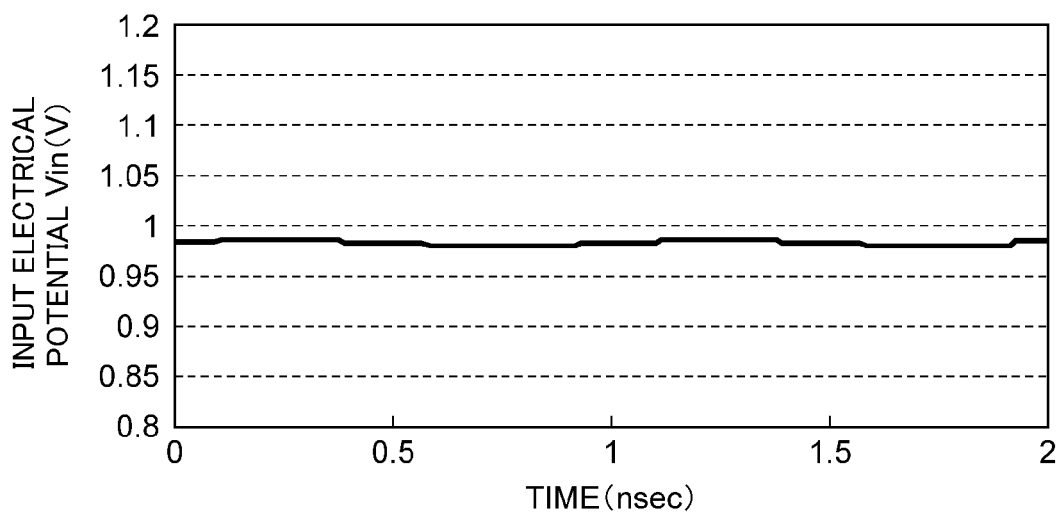
FIG. 3B shows a waveform of an input voltage of the amplifier of FIG. 1.

FIG. 3A shows waveforms of input currents and output voltages of the amplifier 10, and FIG. 3B shows a waveform of an input voltage of the amplifier 10. In FIG. 3A, the horizontal axis corresponds to time [nsec], and the vertical axis in the left-hand side denotes the current value [mA] obtained by subtracting the input current Iinn from the input current Iinp for the waveform A, and the vertical axis in the right-hand side denotes the voltage value [mV] obtained by subtracting the output voltage Voutn from the output voltage Voutp for the waveform B. In FIG. 3B, the horizontal axis denotes time [nsec], and the vertical axis denotes the input voltage Vin [V] of the input 10a.

As shown in FIG. 3A, in the amplifier 10, even if the input currents, Iinp and Iinn, accompany with some offset, the offset is compensated for the output voltages, Voutp and Voutn. Further, as shown in FIG. 3B, the input voltage Vin is about 1 V, when the amplifier 10 operates.

As described above, in the amplifier 10, the compensation circuit 60 outputs the first offset control signal Vcntp and the second offset control signal Vcntn based on the voltage signals, Voutp and Voutn. The first offset control signal Vcntp is input to the base 66b of the third transistor 66 constituting the differential amplifier, and the second offset control signal Vcntn is input to the base 67b of the fourth transistor 67 constituting the differential amplifier to adjust the collector currents Ic3 and Ic4. Since the collector current Ic3 is shunted from the first load current IL1 and the collector current Ic4 is shunted from the second load current IL2, the first load current IL1 and the second load current IL2 is adjusted to cancel the offset between the voltage signals, Voutp and Voutn by adjusting the collector currents, Ic3 and Ic4. Further, since the current amplification factor of each of the first transistor 21 and the second transistor 22 is about 1, the variation of the collector currents, Ic3 and Ic4, is equivalent to the offset between the photocurrents, Iinp and Iinn, which saves the power consumption.

Further, the voltage applied to the first PD 2 and the second PD 3, which is obtained by subtracting the input voltage Vin of the amplifier 10 from the power supply voltage Vpd, is enough as the bias voltages of the first PD2 and the second PD 3, since the input voltage Vin is as low as 1 V.

[Second Embodiment]

Figure 4:
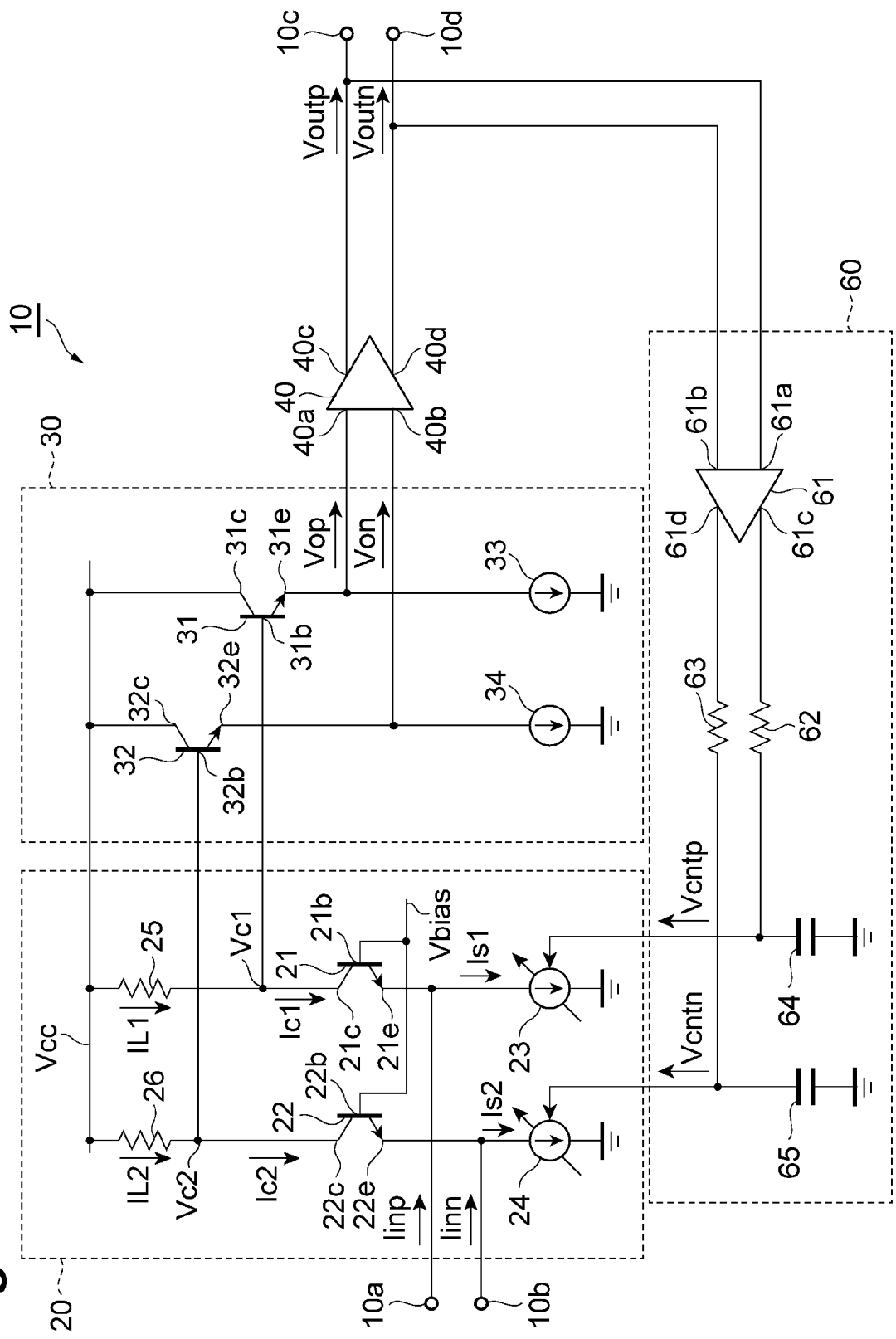
FIG. 4 is a circuit diagram of an amplifier according to a second embodiment of the present invention.

FIG. 4 is a circuit diagram of an amplifier according to a second embodiment. As shown in FIG. 4, an amplifier 10 is configured to compensate for the offset between the complementary voltage signals by controlling the currents of the first current source 23 and the second current source 24; and the TIA 20 and the compensation circuit 60 are different from those of the above-described amplifier 10 according to the first embodiment.

That is, in the compensation circuit 60 according to the second embodiment, the output 61c of the amplifier 61 is connected to the first current source 23 through the low pass filter configured by the resistor 62 and the capacitor 64 and the output 61d of the amplifier 61 is connected to the second current source 24 through the low pass filter configured by the resistor 63 and the capacitor 65. Thus, the compensation circuit 60 omits the differential amplifier circuit configured by the third transistor 66, the fourth transistor 67, and the third current source 68.

Further, in the TIA 20 according to the second embodiment, the first current source 23 and the second current source 24 are not constant current source but voltage-controlled current sources. The first current source 23 outputs a current Is1, which is controlled by the first offset control signal Vcntp. Similarly, the second current source 24 outputs a current Is2, which is controlled by the second offset control signal Vcntn. Each of the first current source 23 and the second current source 24 is configured by, for example, a emitter-grounded transistor, and the offset control signals output from the compensation circuit 60 are input to the bases thereof.

In other words, the compensation circuit 60 adjusts the currents of the first current source 23 and the second current source 24, which flow through the first load resistor 25 and the second load resistor 26, based on the offset between the complementary voltage signals. The currents of the first current source 23 and the second current source 24 are adjusted to cancel the offset between the differential voltage signals.

An operation of the amplifier 10 according to the second embodiment will be described. Here, an operation of compensating for an offset will be described. Since the other operations of the amplifier 10 according to the second embodiment are the same as those of the amplifier 10 according to the first embodiment, the description thereof will be omitted. Similarly to the first embodiment, a difference between the voltage signals, Voutp and Voutn, output from the amplifier 40 are amplified by the amplifier 61. Further, one of the complementary signals output from the amplifier 61 is output as a first offset control signal Vcntp with a low frequency component filtered through the resistor 62 and the capacitor 64, and the other of the complementary signals is output as a second offset control signal Vcntn with a low frequency filtered through the resistor 63 and the capacitor 65. In the second embodiment, the first offset control signal Vcntp is input to a control terminal of the first current source 23, and the second offset control signal Vcntn is input to a control terminal of the second current source 24. Accordingly, the current Is1 of the first current source 23 and the current Is2 of the second current source 24 are controlled to adjust the first load current IL1 and the second load current IL2.

For example, when the photocurrent Iinp is larger than the average current Iave, which is an average current value of the photocurrents, Iinp and Iinn, by a predetermined offset current Ioff and the photocurrent Iinn is smaller than the average current Iave by the offset current Ioff; the collector current Ic1 decreases by the offset current Ioff and the collector current Ic2 increases by the offset current Ioff, as compared with a state of no offset. Further, the collector current Ic1 is almost equal to the first load current IL1 and the collector current Ic2 is almost equal to the second load current IL2. Therefore, the first load current IL1 decreases by the offset current Ioff, and the second load current IL2 increases by the offset current Ioff. As a result, the voltage signal Voutp is larger than the voltage signal Voutn.

At this time, the first offset control signal Vcntp is larger than the second offset control signal Vcntn. The first offset control signal Vcntp is input to the first current source 23 and the second offset control signal Vcntn is input to the second current source 24 so that the current Is1 increases by the offset current Ioff and the current Is2 decreases by the offset current Ioff. Here, the current Is1 is almost equal to the sum of the photocurrent Iinp and the first load current IL1 Thus, when the current Is1 increases by the offset current Ioff, the first load current IL1 increases by the offset value Ioff. Similarly, the current Is2 is almost equal to the sum of the photocurrent Iinn and the second load current IL2. Thus, when the current Is2 decreases by the offset current Ioff, the second load current IL2 decreases by the offset current Ioff.

Accordingly, the voltage drop at the first load resistor 25 increases, and the collector voltage Vc1 of the first transistor 21 decreases. Further, the voltage drop at the second load resistor 26 decreases, and the collector voltage Vc2 of the second transistor 22 increases. Thus, changes of the first load current IL1 and the second load current IL2, which are caused by the offset between the photocurrents, Iinp and Iinn, are compensated for by the compensation circuit 60. As a result, a difference between the voltage signals, Voutp and Voutn, decreases, and the offset between the voltage signals, Voutp and Voutn is compensated for.

Meanwhile, when the photocurrent Iinp is smaller than the average current Iave by the offset current Ioff and the photocurrent Iinn is larger than the average current Iave by the offset current Ioff, the collector current Ic1 increases by the offset current Ioff and the collector current Ic2 decreases by the offset current Ioff, as compared with a state of no offset. Further, the first load current IL1 increases by the offset current Ioff, and the second load current IL2 decreases by the offset current Ioff. As a result, the voltage signal Voutp is smaller than the voltage signal Voutn.

Then, the first offset control signal Vcntp is smaller than the second offset control signal Vcntn. The first offset control signal Vcntp is input to the first current source 23 and the second offset control signal Vcntn is input to the second current source 24 so that the current Is1 decreases by the offset current Ioff and the current Is2 increases by the offset current Ioff. The first load current IL1 decreases by the offset current Ioff, and the current value of the second load current IL2 increases by the offset current Ioff. Accordingly, the voltage drop at the first load resistor 25 decreases, and the collector voltage Vc1 of the first transistor 21 increases. Further, the voltage drop at the second load resistor 26 increases, and the collector voltage Vc2 of the second transistor 22 decreases. Thus, changes of the load current IL1 and the second load current IL2, which are caused by the offset between the photocurrents, Iinp and Iinn, are compensated for by the compensation circuit 60. As a result, a difference between the voltage signals, Voutp and Voutn, decreases, and the offset between the voltage signals, Voutp and Voutn, is compensated for.

The amplifier 10 according to the second embodiment also performs the same function as the amplifier 10 according to the first embodiment. Further, in the amplifier 10 according to the second embodiment, the first current source 23 and the second current source 24 are voltage-controlled current sources, the first offset control signal Vcntp is input to the first current source 23, and the second offset control signal Vcntn is input to the second current source 24. Thus, the current Is1 of the first current source 23 and the current Is2 of the second current source 24 are controlled to adjust the first load current IL1 and the second load current IL2 and the offset between the voltage signals, Voutp and Voutn, can be compensated for.

[Third Embodiment]

Figure 5:
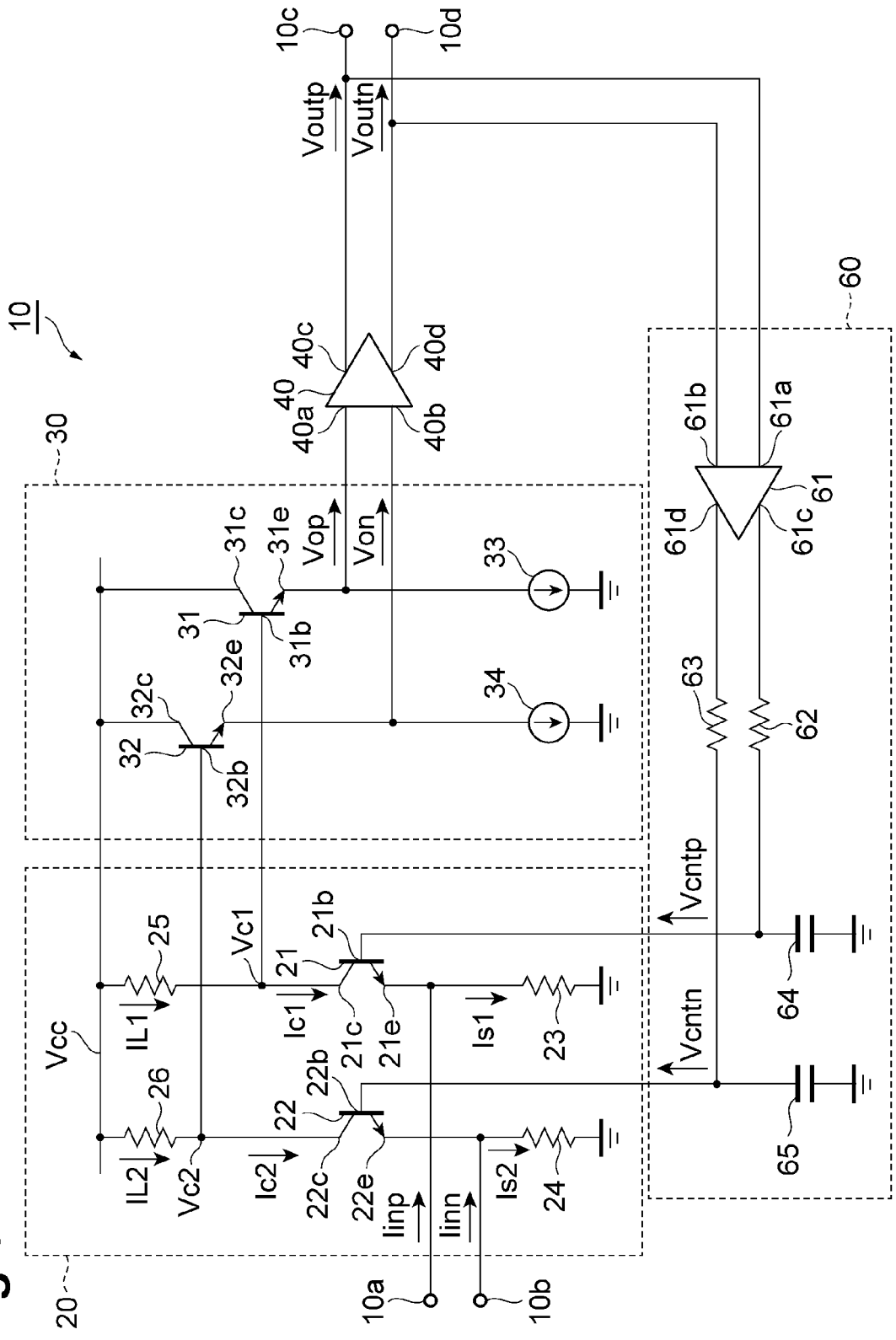
FIG. 5 is a circuit diagram of an amplifier according to a third embodiment of the present invention.

FIG. 5 is a circuit diagram of an amplifier according to a third embodiment. As shown in FIG. 5, an amplifier 10 is configured to compensate for the offset between the complementary voltage signals by controlling base voltages of the first transistor 21 and the second transistor 22, and the TIA 20 and the compensation circuit 60 are different from those of the above-described amplifier 10 according to the first embodiment.

That is, in the compensation circuit 60 according to the third embodiment, the output 61c of the amplifier 61 is connected to the base 21b of the first transistor 21 through a low pass filter configured by the resistor 62 and the capacitor 64, and the output 61d of the amplifier 61 is connected to the base 22b of the second transistor 22 through a low pass filter configured by the resistor 63 and the capacitor 65. Thus, the compensation circuit 60 does not include a differential amplifier circuit configured by the third transistor 66, the fourth transistor 67, and the third current source 68.

Further, in the TIA 20 according to the third embodiment, the first current source 23 and the second current source 24 are resistors, the resistance of which is about 500Ω.

In other words, the compensation circuit 60 feeds the offset control signals back to the base 21b of the first transistor 21 and the base 22b of the second transistor 22 of the base-grounded circuit.

Next, an operation of the amplifier 10 according to the third embodiment will be described. Here, an operation of the compensation of the offset will be described. Since the other operations thereof are the same as those of the amplifier 10 according to the first embodiment, the description thereof will be omitted. Similarly to the first embodiment, a difference between the voltage signals, Voutp and Voutn, output from the amplifier 40 is amplified by the amplifier 61. Further, one of the complementary signals output from the amplifier 61 is output as a first offset control signal Vcntp with a low frequency component filtered through the resistor 62 and the capacitor 64, and the other of the complementary signals is output as a second offset control signal Vcntn with a low frequency component filtered through the resistor 63 and the capacitor 65. In the third embodiment, the first offset control signal Vcntp is input to the base 21b of the first transistor 21 as a first bias signal, and the second offset control signal Vcntn is input to the base 22b of the second transistor 22 as a second bias signal. Accordingly, the collector current Ic1 of the first transistor 21 and the collector current Ic2 of the second transistor 22 are controlled to adjust the first load current IL1 and the second load current IL2.

For example, when the photocurrent Iinp is larger than the average current Iave, which is an average of the photocurrents, Iinp and Iinn, by a predetermined offset current Ioff and the photocurrent Iinn is smaller than the average current Iave by the offset current Ioff, the emitter level of the first transistor 21 rises and the emitter level of the second transistor 22 falls. That is, the bias voltage between the base and the emitter of the first transistor 21 decreases and the equivalent resistance of the first transistor 21 increases. Meanwhile, a bias voltage between the base and the emitter of the second transistor 22 increases and the equivalent resistance of the second transistor 22 decreases.

At this time, as the equivalent resistance of the first transistor 21 increases, an intermediate potential Vc1 of a resistance division circuit configured by the first load resistor 25 and the equivalent resistor of the first transistor 21 rises. Meanwhile, an intermediate level Vc2 of a circuit configured by the second load resistor 26 and the equivalent resistor of the second transistor 22 falls. The compensation circuit 60 amplifies a difference between the level Vc1 with rising and the level Vc2 with falling, and feeds the control signal Vcntp back to the base 21b of the first transistor 21 and also the control signal Vcntn back to the base 22b of the second transistor 22 as a negative feedback circuit. That is, as the level Vc1 rises, the control signal Vcntp increases. As the level Vc2 falls, the control signal Vcntn decreases.

When the control signal Vcntp input to the first transistor 21 increases, the bias voltage between the base and the emitter of the first transistor 21 increases, and the equivalent resistance of the first transistor 21 decreases. In contrast, when the control signal Vcntn input to the second transistor 22 decreases, the bias voltage between the base and emitter of the second transistor 22 decreases, and the equivalent resistance of the second transistor 22 increases. As a result, the level Vc1 falls, and inversely the level Vc2 rises. That is, the offset between the potentials Vc1 and Vc2 can be compensated for by the feedback operation of the compensation circuit 60.

[Fourth Embodiment]

Figure 6:
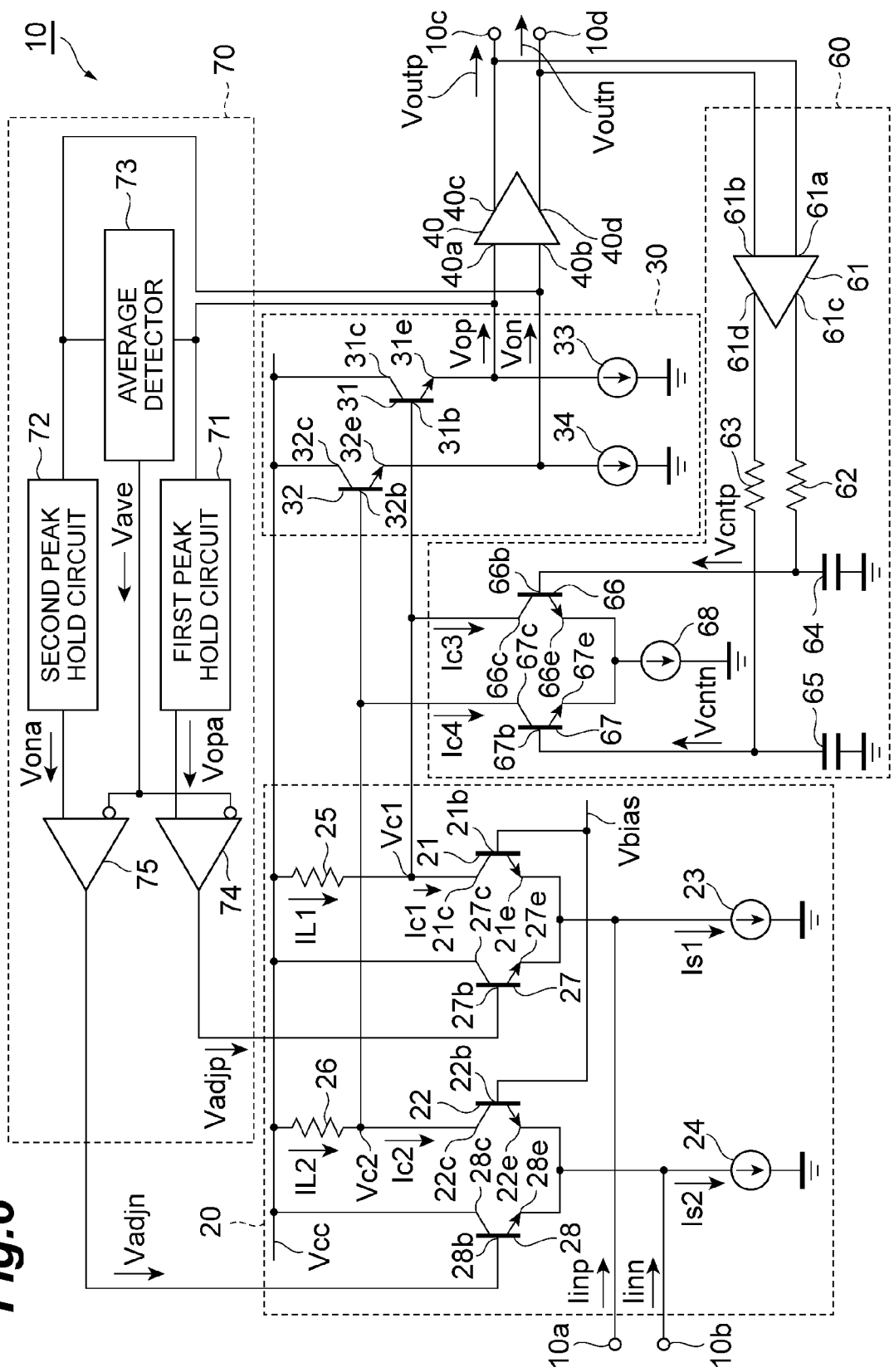
FIG. 6 is a circuit diagram of an amplifier according to a fourth embodiment of the present invention.

FIG. 6 is a circuit diagram of an amplifier according to a fourth embodiment. As shown in FIG. 6, an amplifier 10 according to the fourth embodiment is an amplifier configured by adding circuits for adjusting an amplitude of the voltage signals, Voutp and Voutn, to the amplifier 10 according to the first embodiment. An amplitude adjusting circuit 70, which is additionally included, and the TIA 20, which further includes a fifth transistor 27 and a sixth transistor 28, are different from the amplifier 10 according to the first embodiment.

The amplitude adjusting circuit 70 is for adjusting an amplitude of the voltage signals, Voutp and Voutn, and includes a first peak hold circuit 71, a second peak hold circuit 72, an average detector 73, a differential amplifier 74 (first differential amplifier), and a differential amplifier 75 (third differential amplifier). The first peak hold circuit 71 and the second peak hold circuit 72 are for detecting and holding a peak value of an input signal. An input of the first peak hold circuit 71 is connected to the emitter 31e of the transistor 31, and an output of the first peak hold circuit 71 is connected to a non-inverting input of the differential amplifier 74. An input of the second peak hold circuit 72 is connected to an emitter 32e of the transistor 32, and an output of the second peak hold circuit 72 is connected to a non-inverting input of the differential amplifier 75. The average detector 73 is for detecting an average voltage of two input signals. One of inputs of the average detector 73 is connected to the emitter 31e of the transistor 31, the other of the inputs of the average detector 73 is connected to the emitter 32e of the transistor 32, and an output of the average detector 73 is connected to an inverting inputs of the differential amplifiers 74 and 75.

The fifth transistor 27 is, for example, an NPN transistor. A base 27b (fifth control terminal) of the fifth transistor 27 is connected to an output of the differential amplifier 74. The collector 27c (the other of current terminals) of the fifth transistor 27 is connected to the power supply Vcc. An emitter 27e (one of the current terminals) of the fifth transistor 27 and the emitter 21e of the first transistor 21 are connected to the input 10a and an end of the first current source 23. The sixth transistor 28 is, for example, an NPN transistor. A base 28b (sixth control terminal) of the sixth transistor 28 is connected to an output of the differential amplifier 75. A collector 28c (the other of current terminals) of the sixth transistor 28 is connected to the power supply Vcc. An emitter 28e (one of the current terminals) of the sixth transistor 28 and the emitter 22e of the second transistor 22 are connected to the input 10b and one end of the second current source 24.

In other words, the TIA 20 includes an additional transistor for bypassing a current, which flows through the current source from the series circuit. The amplifier 10 further includes the first peak hold circuit 71 for detecting and holding a peak value of one of differential voltage signals, the second peak hold circuit 72 for detecting and holding a peak value of the other of differential voltage signals, the average detector 73 for detecting an average of the complementary voltage signals, and the amplitude adjusting circuit for adjusting currents, which flow through the additional transistors respectively, based on a difference between one of the peak values and the average and a difference between the other of the peak values thereof and the average, and bypassing the currents, which flow through the series circuits respectively.

Next, an operation of the amplifier 10 according to the fourth embodiment will be described, in particular, an operation of adjusting the amplitude will be described. Since the other operations thereof are the same as those of the amplifier 10 according to the first embodiment, the description thereof will be omitted. A voltage signal Vop output from the emitter 31e of the transistor 31 is input to the first peak hold circuit 71, and a first peak voltage Vopa, which is a peak value of the voltage signal Vop, is detected and held. A voltage signal Von output from the emitter 32e of the transistor 32 is input to the second peak hold circuit 72, and a second peak voltage Vona, which is a peak value of the voltage signal Von, is detected and held. Further, the voltage signals, Vop and Von are input to the average detector 73, and an average Vave of the voltage signals, Vop and Von, is detected.

In the differential amplifier 74, a difference between the first peak voltage Vopa and the average Vave; that is, an amplitude of the voltage signal Vop is detected. In the differential amplifier 75, a difference between the second peak voltage Vona and the average Vave; that is, an amplitude of the voltage signal Von is detected. The signal detected by the differential amplifier 74 is output to the base 27b of the fifth transistor 27 as a first amplitude adjustment signal Vadjp, and the signal detected by the differential amplifier 75 is output to the base 28b of the sixth transistor 28 as a second amplitude adjustment signal Vadjn. That is, the differential amplifier 74 operates as a first circuit to output a signal whose amplitude is adjusted, and the differential amplifier 75 operates as a second circuit to output a signal whose amplitude is adjusted.

The envelop signal of the peak value of the voltage signal Vop, that is, the signal Vopa rectified from the voltage signal Vop includes both Direct Current (DC) and Alternating Current (AC) components. In the differential amplifier 74, in order to extract only the AC component thereof, a difference between the signal Vopa and the output Vave of the average detector 73 is calculated to generate the first amplitude adjustment signal Vadjp corresponding to the amplitude of the voltage signal Vop. Similarly, The differential amplifier 75 outputs the second amplitude adjustment signal Vadjn corresponding to the amplitude of the voltage signal Von. For example, when the voltage signal Vop increases and the first amplitude adjustment signal Vadjp increases, a base voltage of the fifth transistor 27 rises and a current flowing through the fifth transistor 27 increases. Then, a current flowing through the first transistor 21 relatively decreases, and a voltage drop at the first load resistor 25 decreases.

That is, the voltage signal Vop increases, and the AC component decreases at the same time. Since an increase of the DC component of the voltage signal Vop is counterbalanced by the compensation circuit 60, only the AC component decreases. Thus, the amplitude of the voltage signal Vop is adjusted. Regarding the voltage signal Von, since the second amplitude adjustment signal Vadjn is fed back to the base 28b of the sixth transistor 28, the amplitude of the voltage signal Von is adjusted. For the voltage signals, Vop and Von, which are complementary to each other, since each amplitude thereof is adjusted based on the same average of the two voltage signals, the two amplitudes thereof coincide with each other.

The amplifier 10 according to the fourth embodiment also performs the same effect as the amplifier 10 according to the first embodiment. Further, the amplifier 10 according to the fourth embodiment includes the amplitude adjusting circuit 70. Therefore, even when the photocurrents, Iinp and Iinn, are unbalanced, the first amplitude Vopa of the voltage signal Vop and the second amplitude Vona of the voltage signal Von are adjusted by the amplitude adjusting circuit 70, and a difference between the two amplitudes of the voltage signals, Voutp and Voutn, are reduced.

[Fifth Embodiment]

Figure 7:
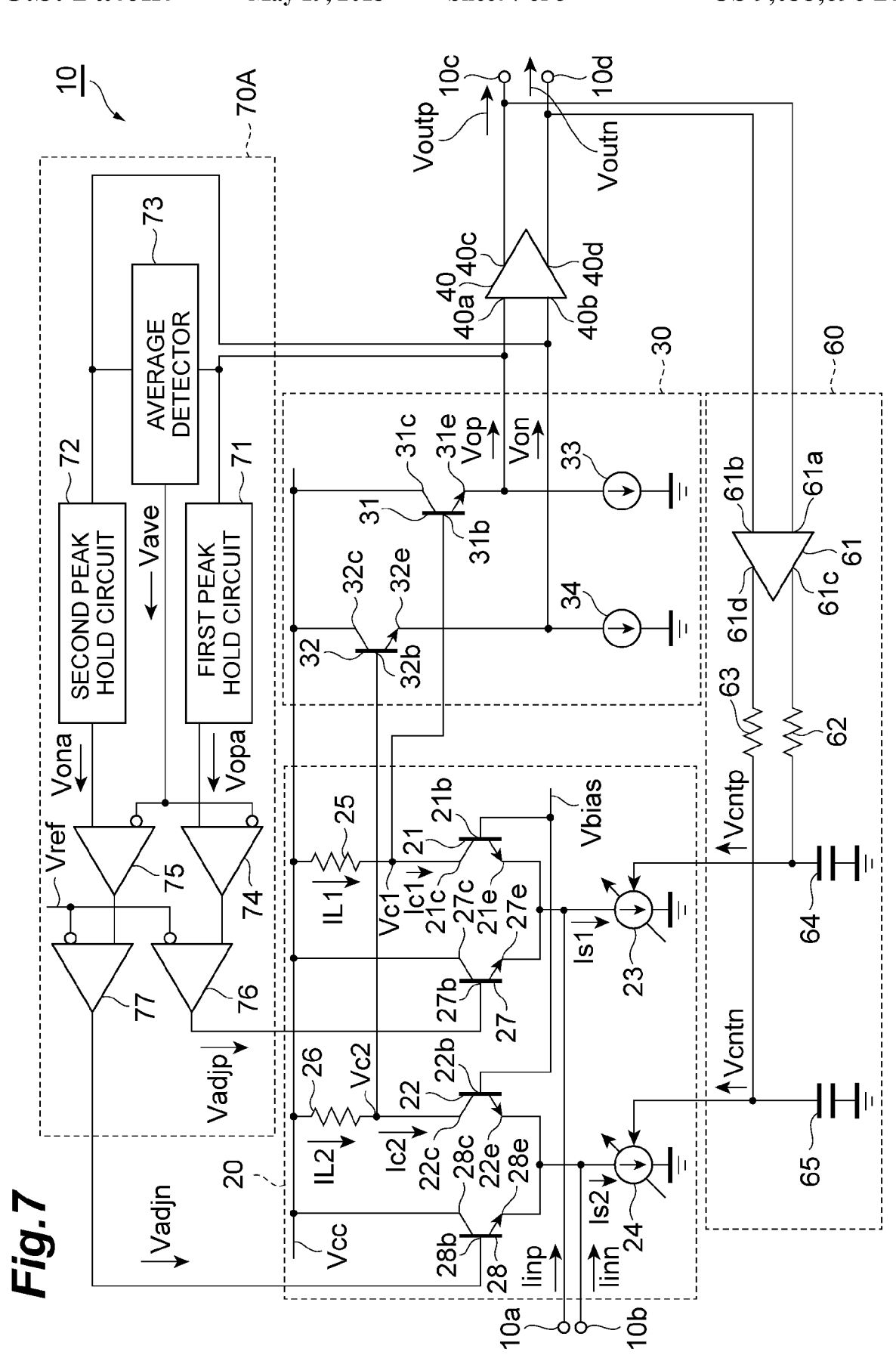
FIG. 7 is a circuit diagram of an amplifier according to a fifth embodiment of the present invention.

FIG. 7 is a circuit diagram of an amplifier according to a fifth embodiment. As shown in FIG. 7, an amplifier 10 according to the fifth embodiment is configured by adding a circuit for adjusting an amplitude to the amplifier 10 according to the second embodiment. An amplitude adjusting circuit 70A, which is additionally included, and the TIA 20, which further includes a fifth transistor 27 and a sixth transistor 28, are different from the amplifier 10 according to the second embodiment.

Further, the amplitude adjusting circuit 70A includes two differential amplifiers 76 and 77. The former differential amplifier 76 receives an output of the differential amplifier 74, and outputs a difference between the output of the differential amplifier 74 and a reference voltage Vref to a base 27b of the fifth transistor 27 as a first amplitude adjustment signal Vadjp. The latter differential amplifier 77 receives an output of the differential amplifier 75, and outputs a difference between the output of the differential amplifier 75 and the reference voltage Vref to a base 28b of the sixth transistor 28 as a second amplitude adjustment signal Vadjn. The amplitude adjusting circuit 70A adjusts outputs of the differential amplifiers 74 and 75, that is, the amplitudes of the voltage signals, Vop and Von, based on the reference voltage Vref to maintain the amplitudes at a certain value set by the reference voltage Vref.

[Sixth Embodiment]

Figure 8:
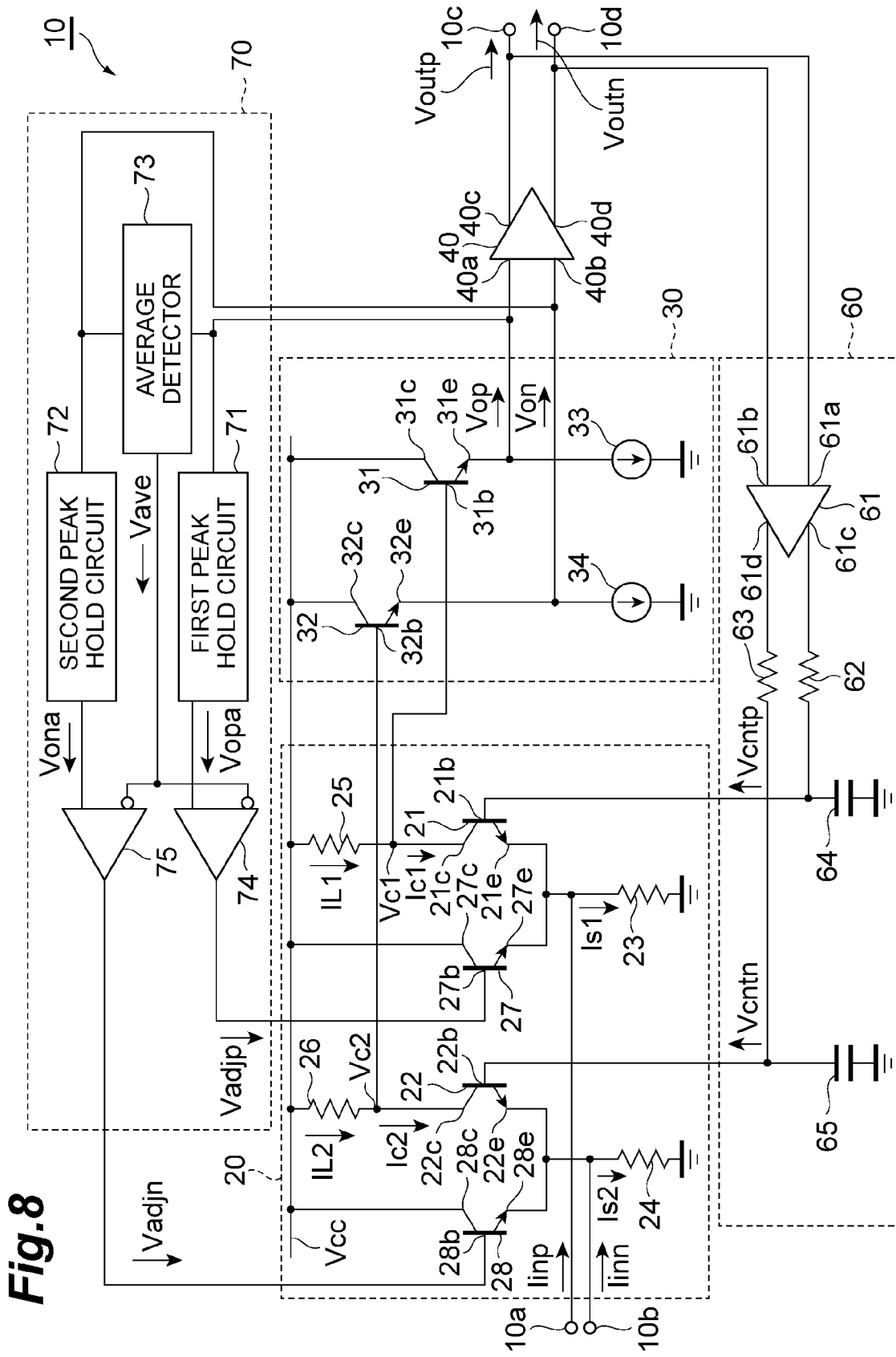
FIG. 8 is a circuit diagram of an amplifier according to a sixth embodiment of the present invention.

FIG. 8 is a circuit diagram of an amplifier according to a sixth embodiment. As shown in FIG. 8, an amplifier 10 according to the sixth embodiment is configured by adding a circuit for adjusting an amplitude to the amplifier 10 according to the third embodiment. The amplitude adjusting circuit 70, which is additionally included, and the TIA 20, which further includes a fifth transistor 27 and a sixth transistor 28, are different from the amplifier 10 according to the third embodiment. Further, since an operation of the amplifier 10 according to the sixth embodiment is configured by adding the amplitude adjustment operation of the amplifier 10 according to the fourth embodiment to the operation of the amplifier 10 according to the third embodiment, the description thereof will be omitted.

The amplifier 10 according to the sixth embodiment also reveals the same effect as the amplifier 10 according to the third embodiment. Further, the amplifier 10 according to the sixth embodiment includes the amplitude adjusting circuit 70, as in the amplifier 10 according to the fourth embodiment. Accordingly, the amplifier 10 according to the sixth embodiment also reveals the same effect as the amplitude adjusting circuit 70 according to the fourth embodiment.

Further, the amplifier according to the present invention is not limited to the amplifiers according to the above-described embodiments. For example, MOS transistors instead of bipolar transistors may be used as the first transistor 21, the second transistor 22, the transistor 31, the transistor 32, the third transistor 66, the fourth transistor 67, the fifth transistor 27, and the sixth transistor 28.

Further, in the first embodiment, the second embodiment, the fourth embodiment, and the fifth embodiment, although the bias voltage Vbias is input to the base 21b of the first transistor 21 and the base 22b of the second transistor 22; it is possible that the first bias voltage is input to the base 21b of the first transistor 21 and the second bias voltage is input to the base 22b of the second transistor 22.

What is claimed is:

1. An amplifier for receiving a pair of complementary current signals and outputting a pair of complementary voltage signals, the amplifier comprising:
   a pair of trans-impedance amplifiers for receiving the complementary current signals and converting the complementary current signals into the complementary voltage signals; and
   a compensation circuit for compensating for an offset between the complementary voltage signals,
   wherein each of the pair of trans-impedance amplifiers comprises a resistor, a transistor, and a current source, which are connected in series to each other between a power source and a ground;
   wherein each of the pair of trans-impedance amplifiers outputs a voltage depending on a current flowing through the resistor and is changed by one of the complementary current signals flowing through the current source, as one of the complementary voltage signals; and
   wherein the compensation circuit receives the complementary voltage signals, and adjusts currents, which flow through the resistors, based on the offset between the complementary voltage signals, and reduces an offset between voltage drops at the resistors.

2. The amplifier according to claim 1, wherein the compensation circuit negatively feeds only the low frequency components of the complementary voltage signals back to the trans-impedance amplifiers.

3. The amplifier according to claim 1, wherein the current source of the trans-impedance amplifier is a constant current source.

4. The amplifier according to claim 1, wherein the compensation circuit comprises a differential circuit having a pair of transistors and a compensation current source connected to both of the transistors;
   wherein the resistors included in the trans-impedance amplifiers are commonly involved in the compensation circuit operable as load resistors of the differential circuit of the compensation circuit; and
   wherein the pair of transistors of the compensation circuit receive the complementary voltage signals, and adjusts compensation currents, which flow through the resistors and merged into the compensation current source, based on the offset between the complementary voltage signals.

5. The amplifier according to claim 1, wherein the current source of the trans-impedance amplifier is a voltage-controlled current source; and
   wherein the compensation circuit adjusts a current of the current source, which flow through the resistor by providing a control voltage to the current source based on the complementary voltage signals.

6. The amplifier according to claim 1, wherein the trans-impedance amplifier has another resistor instead of the current source; and
   wherein the compensation circuit feeds an offset between the complementary voltage signals back to a control terminal of the transistor.

7. The amplifier according to claim 4, wherein each of the trans-impedance amplifier includes another transistor connected in parallel to the transistor for bypassing a current flowing through the resistor and the transistor, and
   the amplifier further comprises:
   a first peak hold circuit for detecting and holding a peak value of one of the complementary voltage signals;
   a second peak hold circuit for detecting and holding a peak value of the other of the complementary voltage signals;
   an average detector for detecting an average of the complementary voltage signals; and
   a first amplitude adjusting circuit for adjusting a current flowing through another transistor in one of the trans-impedance amplifier based on a first difference between the peak value of one of the complementary voltage signals and the average; and
   a second amplitude adjusting circuit for adjusting a current flowing through another transistor in the other of the trans-impedance amplifier based on a second difference between the peak value of the other of the complementary voltage signals and the average.

8. The amplifier according to claim 7,
wherein the first amplitude adjusting circuit compares the first difference with a predetermined reference value, and the second amplitude adjusting circuit compares the second difference with the predetermined reference value.

* * * * *